United States Patent
Zhang et al.

(10) Patent No.: US 10,767,253 B2
(45) Date of Patent: Sep. 8, 2020

(54) MANUFACTURING APPARATUS FOR MANUFACTURING MASK FRAME ASSEMBLY

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xinjian Zhang, Beijing (CN); Dejian Liu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 155 days.

(21) Appl. No.: 15/752,788

(22) PCT Filed: Jul. 31, 2017

(86) PCT No.: PCT/CN2017/095200
§ 371 (c)(1),
(2) Date: Feb. 14, 2018

(87) PCT Pub. No.: WO2018/054168
PCT Pub. Date: Mar. 29, 2018

(65) Prior Publication Data
US 2019/0003034 A1    Jan. 3, 2019

(30) Foreign Application Priority Data

Sep. 26, 2016 (CN) ..................... 2016 2 1081719 U

(51) Int. Cl.
*C23C 14/04*    (2006.01)
*C23C 14/24*    (2006.01)
(Continued)

(52) U.S. Cl.
CPC .......... *C23C 14/042* (2013.01); *B05C 21/005* (2013.01); *C23C 14/24* (2013.01); *H01L 51/0011* (2013.01)

(58) Field of Classification Search
None
See application file for complete search history.

(56) References Cited

U.S. PATENT DOCUMENTS

2006/0011136 A1* 1/2006 Yamazaki ............. C23C 14/042
                                                                118/719
2014/0120796 A1    5/2014 Kim et al.

FOREIGN PATENT DOCUMENTS

CN    1544295 A  * 11/2004    ............. C23C 14/04
CN    1544295 A    11/2004
(Continued)

OTHER PUBLICATIONS

International Preliminary Report on Patentability PCT/CN2017/095200 (Year: 2019).*

(Continued)

*Primary Examiner* — Jethro M. Pence
(74) *Attorney, Agent, or Firm* — Womble Bond Dickinson (US) LLP

(57) ABSTRACT

An embodiment of the present disclosure provides a manufacturing apparatus for manufacturing a mask frame assembly, relates to a technical field of display apparatus manufacturing, which can reduce the friction between a frame and a stage of the manufacturing apparatus for manufacturing the mask frame assembly. The manufacturing apparatus for manufacturing the mask frame assembly provided by an embodiment of the present disclosure includes: a stage for carrying a frame; a resistance reducing part located on the (Continued)

stage, which is configured to reduce the frictional resistance between the frame and the stage when they move relative to each other.

12 Claims, 5 Drawing Sheets

(51) Int. Cl.
*B05C 21/00* (2006.01)
*H01L 51/00* (2006.01)

(56) References Cited

FOREIGN PATENT DOCUMENTS

| CN | 101001972 A | | 7/2007 | |
|---|---|---|---|---|
| CN | 103774087 A | | 5/2014 | |
| CN | 204676141 U | * | 9/2015 | ............. C23C 14/04 |
| CN | 204676141 U | | 9/2015 | |
| CN | 205999471 U | | 3/2017 | |
| JP | 2000-133125 A | | 5/2000 | |

OTHER PUBLICATIONS

International Search Report received for PCT Patent Application No. PCT/CN2017/095200, dated Nov. 7, 2017, 6 pages (2 pages of English Translation and 4 pages of Original Document).

* cited by examiner

MANUFACTURING APPARATUS FOR MANUFACTURING MASK FRAME ASSEMBLY

RELATED APPLICATION

The present application claims the priority of a Chinese patent application No. 201621081719.3, filed on Sep. 26, 2016, which is incorporated herein by reference in its entirety.

FIELD OF THE DISCLOSURE

This disclosure relates to the technical field of display device manufacturing, and in particular, to a manufacturing apparatus for manufacturing a mask frame assembly.

BACKGROUND OF THE DISCLOSURE

In the field of display manufacturing, one way of mask evaporation, such as fine metal mask (FMM) evaporation, is to vapor-deposit an OLED material onto a Low Temperature Poly-silicon (LTPS) substrate by a predetermined process utilizing a pattern of the FMM, thereby forming red, green and blue devices.

After the production of the fine metal mask is completed, the FMM needs to be bonded (e.g., welded) to a frame (e.g., a metal frame) together at a manufacturing apparatus for manufacturing a mask-frame assembly (e.g., a film tensioner), so as to form an assembly consisting of the mask and the frame, hereinafter referred to as a Mask Frame Assembly (MFA).

As the FMM is bonded to the frame, it is usually necessary to exert outward pulling forces between two opposite sides of the FMM so that the FMM is in a stretched state. In order to prevent the FMM shrinking and deforming inwardly after the FMM is bonded with the frame, it is desirable to apply a horizontal inward pushing force (resisting force) in advance to two sides of the frame corresponding to the two opposite sides of the FMM to which the pulling forces are applied when the frame is placed on the stage of the manufacturing apparatus for manufacturing the mask frame assembly prior to bonding the FMM with the frame. After the FMM is bonded, the horizontal inward pushing forces will be removed, and when the pushing force is removed, the frame will generate an outward tension to compensate for the shrinking force of the FMM to prevent the MFA from shrinking and deforming.

In the prior art, in operation, the frame is usually placed on a stage first, and the frame is preliminarily applied horizontal inward pushing forces on the stage. After the pre-applied pushing forces on the frame are removed, the frame, due to its own restoring force, will have tension effect on the mask. However, after the frame is pressed inwardly by the pushing forces, there is a phenomenon of uneven force on the mask during the bonding of the mask to the frame.

SUMMARY OF THE DISCLOSURE

The inventor of the present disclosure has found that one of the causes of the uneven force on the mask occurring when the mask is bonded to the frame is that the frictional resistance between the frame and the stage is excessive and the distribution of resistance between the frame and the stage is less uniform. In order to prevent shrinkage and deformation of the MFA, when the frame is pressed by applying horizontal inward pushing forces directly on two opposite sides of the frame, the sliding friction between the frame and the stage of the manufacturing apparatus (e.g., a film tensioner) will cancel out part of the pushing forces, causing the actual deformation of the frame to be less than the simulated deformation, which in turn causes the tension compensation ability of the frame to the FMM to be changed, affecting the quality of the resulting MFA.

An embodiment of the present disclosure provides a manufacturing apparatus for manufacturing a mask frame assembly, comprising: a stage for carrying a frame; a resistance reducing part located on the stage, which is configured to reduce a frictional resistance between the frame and the stage when they move relative to each other.

Optionally, the resistance reducing part includes a plurality of rolling elements, a top end of each rolling element protrudes from a surface of the stage for placing the frame, and the rolling direction of the plurality of rolling elements is the same as a pushing movement direction of the frame.

Optionally, the rolling elements comprise rolling shafts and rollers sleeved on the rolling shafts, longitudinal axes of the rolling shafts are parallel to the surface of the stage for placing the frame and perpendicular to the pushing movement direction of the frame.

Optionally, the rolling elements comprise balls, grooves are formed on the stage at positions corresponding to the balls, and the balls are disposed in the grooves.

Optionally, the resistance reducing part includes an air supplying member which is configured to blow air towards a side of the frame near the stage when the frame is pressed. Specifically, an air outlet of the air supplying member is used to blow air toward the surface of the frame near the stage when the two opposite sides of the frame are pressed inwards.

Optionally, a plurality of through holes arranged in matrix form are provided in the stage, the air outlet of the air supplying member is communicated with an end of each through hole facing away from the frame. The air supplying member blows air to the surface of the frame near the stage through the through holes.

Optionally, a pressure control valve is provided at a position where each of the through holes is connected to the air outlet of the air supplying member.

Optionally, the air supplying member is further provided with an air dryer.

Optionally, the air supplying member is further provided with an air purifier.

Optionally, the manufacturing apparatus for manufacturing the mask frame assembly further includes a thrust member capable of pushing the opposite sides of the frame inward.

Optionally, the resistance reducing part is evenly arranged on the stage; or arranged in a square frame shape.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure. For those skilled in the art, other drawings can also be obtained based on these drawings without creative efforts.

DETAILED DESCRIPTION OF THE DISCLOSURE

The technical solutions in the embodiments of the present disclosure will be clearly and completely described below with reference to the accompanying drawings in the embodiments of the present disclosure. Apparently, the described embodiments are merely a part but not all of the embodiments of the present disclosure. All other embodiments obtained by a person of ordinarily skilled in the art based on the embodiments of the present disclosure without creative efforts shall fall within the protection scope of the present disclosure.

Figure 1:
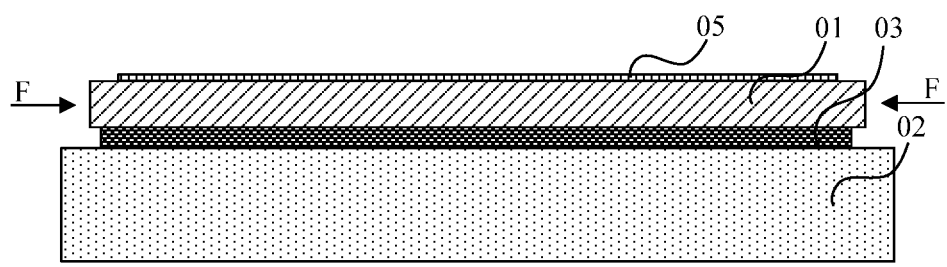
FIG. 1 schematically shows a manufacturing apparatus for manufacturing a mask frame assembly and a film frame assembly according to an embodiment of the present disclosure.
Figure 2:
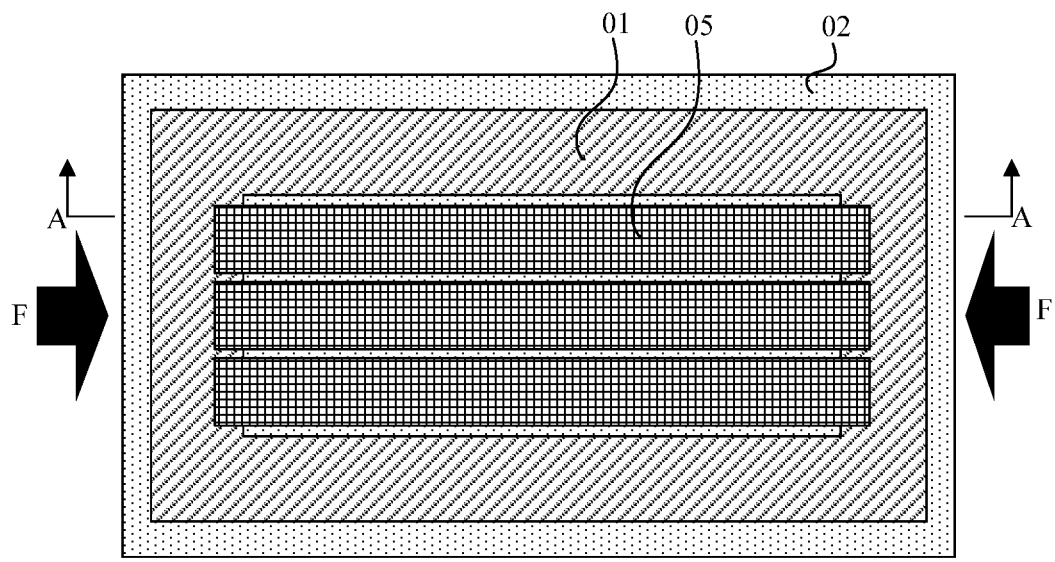
FIG. 2 is a top view of FIG. 1.

An embodiment of the present disclosure provides a manufacturing apparatus for manufacturing a mask frame assembly. As shown in FIG. 1, the manufacturing apparatus includes a stage 02 for carrying a frame 01 and a resistance reducing part 03 disposed on the stage 02. For example, as shown in FIG. 2 (FIG. 2 is a top view of FIG. 1), the resistance reducing part 03 is for reducing a frictional resistance between the frame 01 and the stage 02 when they move relative to each other when the two opposite sides of the frame 01 are pushed inwards.

It should be noted that the present application will be described below by taking the metal frame as an example, and it should be understood that the frame made of other materials is also applicable as long as the frame capable of shrinkable deformation inward when the two opposite sides of the frame are pushed inwardly, and when the pushing force is removed, it will generate an outward restoring tension to compensate for the shrinking force of the mask, and thus prevent the occurrence of MFA shrinkage deformation, thereby achieving the purpose and technical effects of the present application.

In addition, it should be further noted that, firstly, two sides of the metal frame 01 to which the fine metal mask 05 is bonded are positions of the metal frame 01 for receiving the inward pushing forces F. For example, as shown in FIG. 2, the present application is illustrated as follows as an example: a plurality of fine metal masks 05 which are parallel to each other and have a certain gap among them are bonded to the left and right sides of the metal frame 01 in the lengthwise direction of the metal frame 01, therefore, the directions of the inwardly pushing forces F exerted at the two opposite sides of the metal frame 01 are also from the left side and right side (in the direction of the arrow in FIG. 2).

In the description of the present disclosure, it should be understood that the directions or positional relationships indicated by the terms "up", "down", "left", "right", "top" and "horizontal" and the like are based on the orientation or positional relationship of the stage, which is merely for convenience of describing the present disclosure and to simplify the description, rather than indicating or implying that the indicated device or element must have a particular orientation, be constructed and operated in a particular orientation, and thus should not be construed as limiting the disclosure.

Second, the carrying position refers to the position where the metal frame 01 and the stage 02 are in contact with each other when the metal frame 01 is placed on the stage 02.

The inventor of the present application has found that since the fine metal mask 05 is stressed and in stretched state at the time of manufacturing, the fine metal mask 05 itself generates a shrinking force restoring it from the stretched state to natural state when the pulling force is removed after the fine metal mask 05 is bonded to the metal frame 01. By applying a pushing force to the metal frame 01 before the fine metal mask 05 is bonded so that the metal frame 01 is in pressed state, the tension restoring the metal frame 01 to natural state can cancel out some of the shrinking force of the fine metal mask 05 when the pushing force is removed after the fine metal mask 05 is bonded, so as to improve the quality of the FMA obtained. The inventor of the present application has further found that while the inward pushing is applied to the left and right sides of the metal frame 01, because the metal frame 01 is placed on the stage 02, the deformation of the metal frame 01 causes the metal frame 01 and the stage 02 to move relative to each other. The sliding friction generated between the stage 02 and the metal frame 01 is a reacting force to the pushing forces, which will cancel out part of the pushing forces. In this way, the actual deformation of the metal frame 01 is less than the simulated deformation that the applied pushing force should generate. The tension of the metal frame 01 does not match with the shrinking force of the fine metal mask 05 in magnitude, resulting in deformation of the MFA and poor quality.

In order to solve the above problems, an embodiment of the present disclosure provides a manufacturing apparatus for manufacturing a mask frame assembly, comprising: a stage for carrying the frame; a resistance reducing part located on the stage, which is configured to reduce the frictional resistance between the frame and the stage when they move relative to each other. By reducing the frictional force between the metal frame and the stage of the manufacturing apparatus for manufacturing the mask frame assembly, when the inward pushing forces are applied to the metal frame at the two opposite sides of the metal frame, the weakening effect to the pushing force subjected by the metal frame by the frictional resistance is reduced, the error between the actual deformation of the stressed metal frame and the calculated simulated deformation decreases, and then the accuracy of compensating for the shrinking force of the FMM by the tension of the metal frame is improved after attaching the FMM, thereby improving the quality stability of the obtained MFA.

On this basis, when two objects contact and move relative to each other, frictional force opposite to the movement direction will be generated on the contact surfaces of the two objects, the magnitude of the friction force is related to the pressure between the two objects, the roughness of the contact surface and the mode of friction. Therefore, in order to reduce the friction between two objects, the pressure between the two objects and the roughness between the contact surfaces can be reduced, or the sliding friction mode can be converted into the rolling friction mode. In addition, if the two objects no longer contact, the friction between two objects can also be directly eliminated.

The following is a detailed description of different designs of the resistance reducing part 03.

Figure 3:
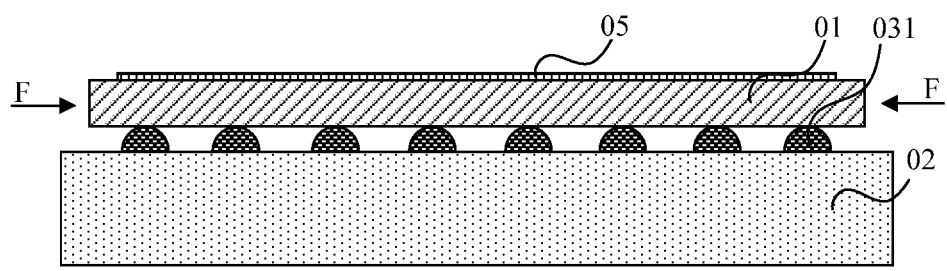
FIG. 3 schematically illustrates a schematic structural view of a resistance reducing part of the manufacturing apparatus for manufacturing the mask frame assembly according to an embodiment of the present disclosure as rolling elements.
Figure 4:
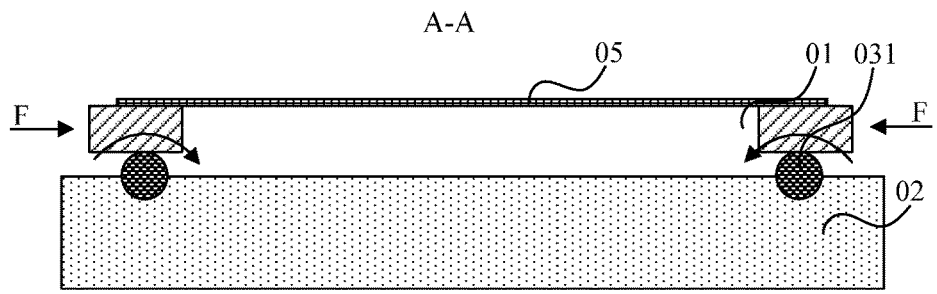
FIG. 4 is a cross-sectional view taken along A-A of FIG. 2.

For example, as shown in FIG. 3, the resistance reducing part 03 includes a plurality of rolling elements 031. The top end of each rolling element 031 protrudes from the top surface of the stage 02 for placing or carrying the metal frame 01. As shown in FIG. 4, the rolling direction of the plurality of rolling elements 031 (as shown by the curved arrow in FIG. 4) is the same as the pushing direction of the metal frame 01.

In this way, as shown in FIG. 4, the sliding friction mode between the stage 02 and the metal frame 01 can be converted to rolling friction mode by providing the plurality of rolling elements 031 on the stage 02. When the metal frame 01 is pressed to deform inward by the pushing forces F at two sides, the plurality of rolling elements 031 can roll along the pushing movement direction of the metal frame 01. Because the frictional force of the rolling friction is less than the frictional force of the sliding friction, the frictional resistance between the stage 02 and the metal frame 01 is reduced, and the influence of friction on the deformation of the metal frame 01 is reduced.

Figure 5:
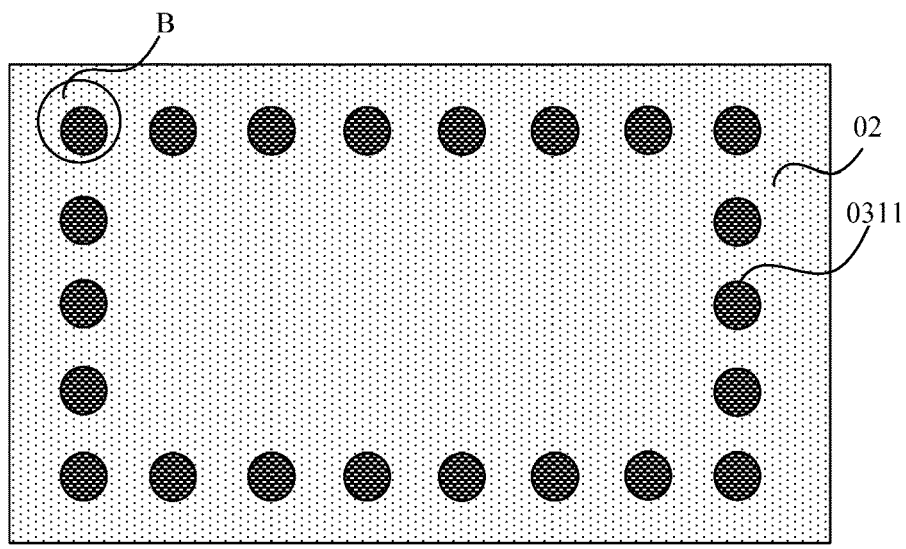
FIG. 5 is a top view of FIG. 3, wherein the rolling elements are balls.
Figure 6:
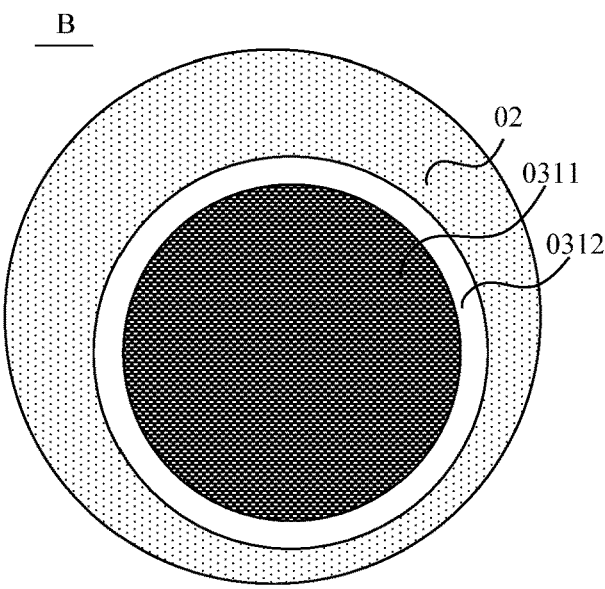
FIG. 6 is a partial enlarged view of region B in FIG. 5.

Optionally, as shown in FIG. 5, the rolling elements 031 includes balls 0311, as shown in FIG. 6 (FIG. 6 is a partial enlarged view of the region B in FIG. 5), and the positions on the stage 02 corresponding to the balls 0311 are machined with grooves 0312. Each ball 0311 is disposed in a groove 0312, wherein the inner diameter of the groove 0312 is slightly larger than the diameter of the ball 0311, so that the ball 0311 can roll within the groove 0312. Alternatively, since the ball 0311 is generally spherical, only one strip-shaped groove 0312 may be provided at the position on the stage 02 corresponding to the same row or the same column of the plurality of balls 0311. The radial section of the groove 0312 is semicircular and the diameter of the semicircle is slightly larger than the diameter of the ball 0311, and a plurality of balls 0311 in the same row or the same column are distributed in the groove 0312 for rolling.

In this way, when the metal frame 01 is placed on the stage 02, as shown in FIG. 4, the metal frame 01 contacts with the top ends of the balls 0311 protruding from the surface of the stage 02 in the groove 0312. When the metal frame 01 is pressed to deform inwardly by the pushing forces F at two sides, the balls 0311 roll in the groove 0312 so that the sliding friction mode between the metal frame 01 and the stage 02 is converted to the rolling friction mode and the frictional resistance is reduced.

Since the pushing forces F exerted on the metal frame 01 are only in the inward directions from the left and right sides and the balls 0311 can roll in all directions in the groove 0312 to drive the metal frame 01 to move in all directions, as shown in FIG. 2, when slight errors in the directions of the pushing forces F at the two sides occur, the metal frame 01 may generate a force causing movement in a front-back direction. In this case, the balls 0311 with smaller sliding friction will move the metal frame 01 in the front-back direction, thus affecting the accuracy of the fine metal mask 05 attached to the metal frame 01, further affecting the quality stability of the MFA.

Figure 7:
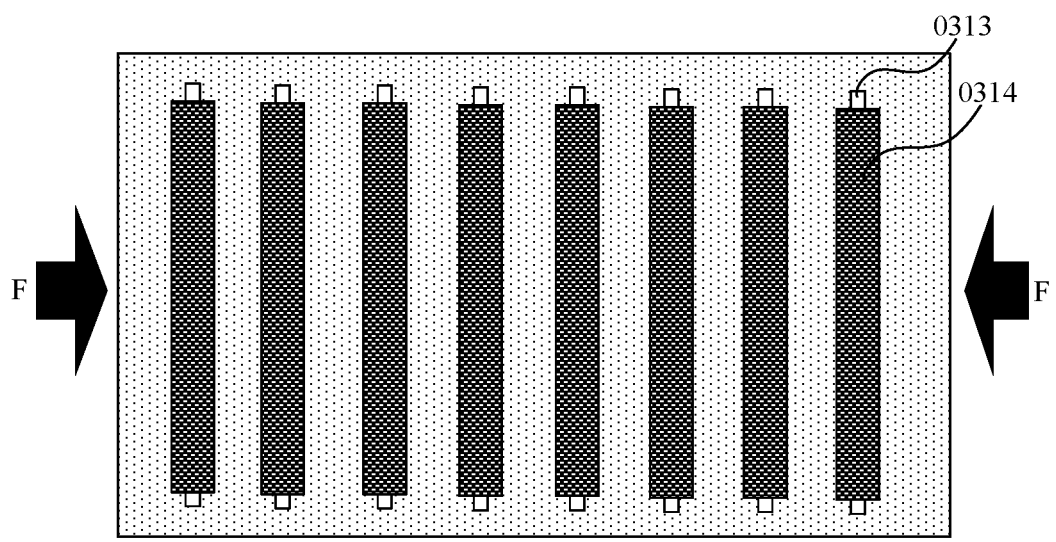
FIG. 7 is a top view of FIG. 3, wherein the rolling elements are rollers.

Therefore, as shown in FIG. 7, optionally, the rolling elements 031 include rolling shafts 0313 and rollers 0314 sleeved on the rolling shafts 0313. The longitudinal axes (not shown) of the rolling shafts 0313 are parallel to the surface of the stage 02 used for placing the metal frame 01 and perpendicular to the directions of the pushing forces F to the metal frame 01.

For example, as shown in FIG. 7, the longitudinal axes of the rolling shafts 0313 are parallel to the upper surface of the stage 02 (the surface on which the metal frame 01 is placed) and perpendicular to the directions of the pushing forces F to the metal frame 01. Two ends of each rolling shaft 0313 are fixed on the stage 02 and a roller 0314 is sleeved on each rolling shaft 0313. The rolling direction of the roller 0314 sleeved on the rolling shaft 0313 can only be the same as that of pushing forces F to the metal frame 01, thus ensuring the accuracy of the rolling direction.

Figure 8:
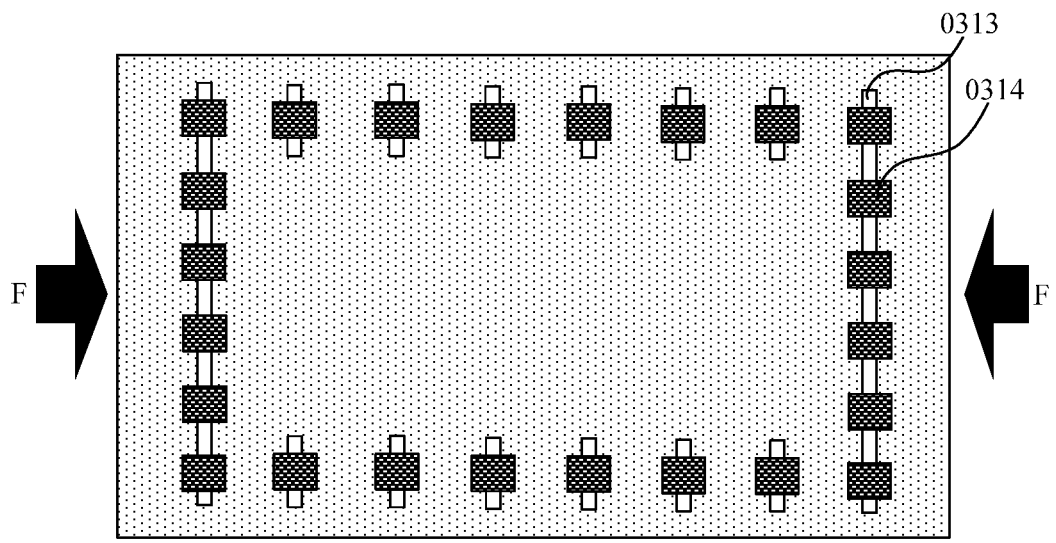
FIG. 8 is a top view of FIG. 3, wherein the rolling elements are rollers according to another situation.

As another example, as shown in FIG. 8, a plurality of rollers 0314 are sleeved onto each of the rolling shafts 0313, and the plurality of rollers 0314 on the same rolling shaft 0313 are rolled at the same speed under the action of the pushing forces F. The longitudinal axis of each of the rolling shafts 0313 is parallel to the upper surface of the stage 02 (the side surface for placing the metal frame 01) and perpendicular to the pushing movement direction of the metal frame 01, so that the movement direction of the rollers 0314 sleeved on different rolling shafts 0313 is also defined to be the same as the pushing movement direction of the metal frame 01.

Due to the fact that a plurality of rollers 0314 are sleeved on the same roller shaft 0313 as shown in FIG. 8, a plurality of rollers 0314 of the same size need to be batch-machined and installed one by one. In view of saving the workload of element machining and installation, the arrangement of the roller shafts 0313 and the rollers 0314 shown in FIG. 7 is a relatively preferable solution.

Figure 9:
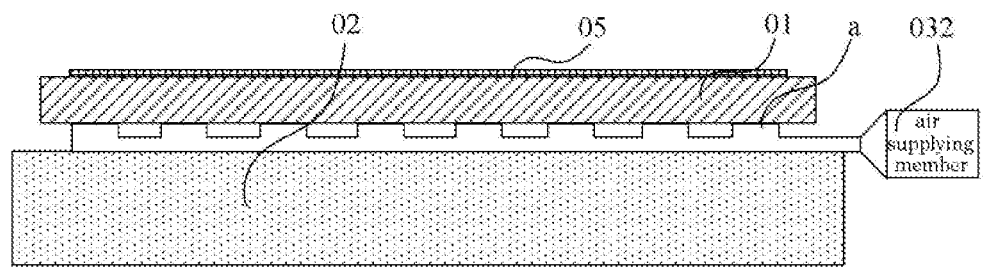
FIG. 9 is a schematic view of the situation where the resistance reducing part is an air supply member.

According to another embodiment of the present application, as shown in FIG. 9, the resistance reducing part 03 includes an air supplying member 032 provided on the stage 02. An air outlet a of the air supplying member 032 is used to blow air to a surface of the metal frame 01 near the stage 02 when the two opposite sides of the metal frame 01 are pushed inwards.

It should be noted that the present disclosure does not limit the specific structure of the air supplying member 032. The air supplying member 032 may be an air cylinder for storing compressed air, or may be a fan or other high-speed air supplying device, as long as the air supply member 032 can blow air to the lower surface of the metal frame 01 (the surface close to the stage 02) so that the relative pressure between the metal frame 01 and the stage 02 can be reduced, and by lifting by the air flow, the metal frame 01 separates from the surface of the stage 02 and floats above the stage 01.

In this way, because the upward blowing air can push the metal frame 01 upward, part of the pressure between the metal frame 01 and the stage 02 caused by the gravity of the metal frame 01 can be cancelled out. Because the pressure between the metal frame 01 and the stage 02 is reduced, the frictional resistance between the metal frame 01 and the stage 02 can be reduced when the metal frame 01 is pressed to deform by the inward pushing forces from two sides.

Figure 10:
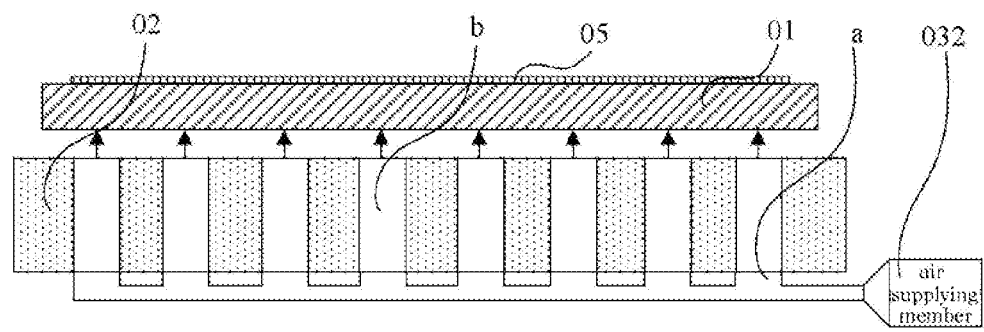
FIG. 10 is a schematic structural view showing that through holes are provided in a stage of the manufacturing apparatus for manufacturing the mask frame assembly.

Optionally, as shown in FIG. 10, a plurality of through holes b arranged in a matrix form are provided in the stage 02, and an air outlet a of the air supplying member 032 is respectively connected with an end of each through hole b facing away from the metal frame 01.

Air is blown through the through holes b to the lower surface of the metal frame 01 (the surface close to the stage 02) when the metal frame 01 is placed on the stage 02. Because the stage 02 has a good surface flatness, the metal frame 01 can be smoothly and stably placed on the stage 02. The airflow blown through the through holes b to the lower surface of the metal frame 01 is relatively uniform, the stability of the metal frame 01 is improved.

When the flow rate of the air blown by the air supplying member 032 is low, as shown in FIG. 9, the upward pushing force generated by the airflow to the metal frame 01 is insufficient to overcome the gravity of the metal frame 01 to separate the metal frame 01 from the stage 02. At this time, the upward pushing force to the metal frame 01 causes the weight of the metal frame 01 to be reduced, so that the pressure between the metal frame 01 and the stage 02 is reduced, thereby reducing the frictional resistance between the metal frame 01 and the stage 02. When the flow rate of the air blown by the air supplying member 032 is increased, as shown in FIG. 10, the upward pushing force generated by the air flow to the metal frame 01 may push the metal frame 01 (the pushing direction of the airflow to the metal frame 01 is as shown by the arrow in FIG. 10) overcoming the weight of the metal frame 01, so that the metal frame 01 leaves the surface of the stage 02 under the action of the airflow and floats above the stage 02. At this time the metal frame 01 and the stage 02 no longer contact, so as to completely eliminate the frictional resistance between the metal frame 01 and the stage 02 during the relative movement and reduce the error between the actual deformation and the simulated deformation of the metal frame 01 when the metal frame 01 is exerted inward pushing forces F from two opposite sides.

In the present disclosure, the cross-sectional shape of the through hole b is not particularly limited, and may be circular or rectangular or polygonal. An optional solution is to match the shape of the air outlet a of the air supplying member 032 to improve the utilization of the discharged air from the air outlet a. In addition, optionally, the cross-sectional shapes of the air outlet a and the through hole b are centrosymmetric shape, such as polygon or circle.

Figure 11:
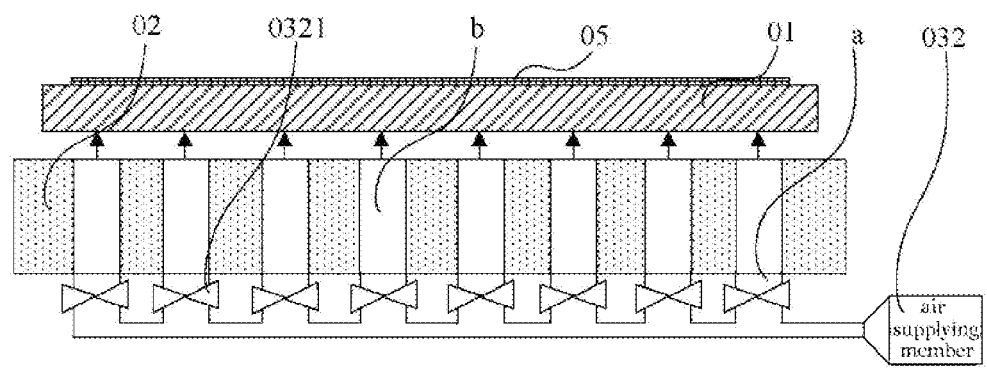
FIG. 11 is a schematic structural view showing that an air supplying member in the manufacturing apparatus for manufacturing the mask frame assembly is provided with a pressure control valve.

Optionally, as shown in FIG. 11, a pressure control valve 0321 is provided at a position where each through hole b is connected to the air outlet a of the air supplying member 032.

In this way, each of the air outlets a of the air supplying member 032 blowing air to the lower surface of the metal frame 01 can control the on/off and the flow rate of the airflow independently by the pressure control valve 0321. The flow velocity of the airflow can therefore be adjusted locally according to the airflow condition at various positions on the lower surface of the metal frame 01 so that the flow velocity of the airflow at various positions on the lower surface of the metal frame 01 is uniform and the stability of the metal frame 01 is improved. Target thresholds of airflow velocity can be set in advance. When the air flow rate at any air outlet a is insufficient or exceeds the target threshold, the air flow rate at the air outlet a may be adjusted to ensure that the lower surface of the entire metal frame 01 is subjected to uniform pushing force of the air, improving the stability of the metal frame 01.

Figure 12:
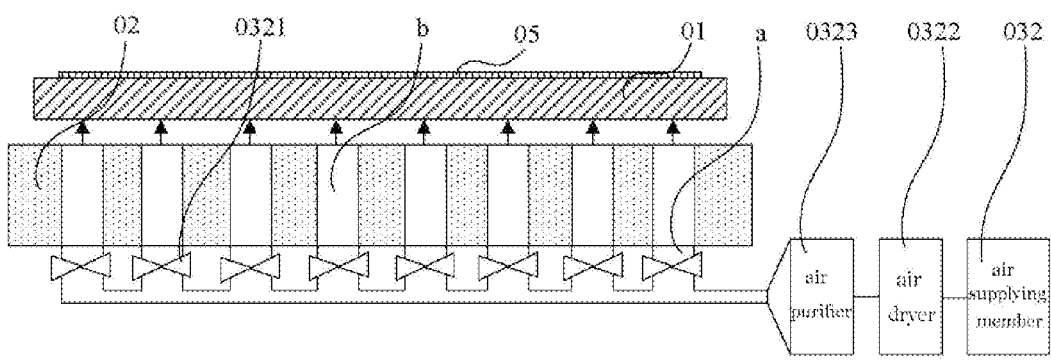
FIG. 12 is a schematic structural view showing that the air supplying member in the manufacturing apparatus for manufacturing the mask frame assembly is further provided with an air dryer and an air purifier.

Optionally, as shown in FIG. 12, an air dryer 0322 is further disposed on the air supplying member 032.

Since moisture is contained in the compressed outside air provided by the air supplying member 032, the moisture, oxygen and metal can easily have oxidization reaction when the air is blown to the lower surface of the metal frame 01, so that the metal frame 01 and the fine metal mask 05 attached to the metal frame 01 may be polluted and corroded, thereby affecting the quality of the resulting MFA. Therefore, an air dryer 0322 is provided on the air supply member 0322. The air dryer 0322 can dry the air output from the air supplying member 032, so as to prevent the moisture in the air from polluting the metal frame 01 and the fine metal mask 05 attached to the metal frame 01.

The specific structure of the air dryer 0322 described above is not particularly limited in the present disclosure, and may be an air-permeable box in which a water-absorbing material is placed or may be other structures as long as it can absorb moisture in the passing air.

Optionally, as shown in FIG. 12, an air purifier 0323 is further disposed on the air supplying member 032.

In this way, the air blown by the air supply unit 032 passes through the air dryer 0322 and the air purifier 0323 to be dried and purified, and compressed Clean Dry Air (CDA) is blown out. The CDA is blown to the lower surface of the metal frame 01, the pollution of the impurities, moisture and the like in the air to the metal frame 01 and fine metal mask 05 is effectively reduced, improving the quality of MFA obtained.

The specific structure of the air purifier 0323 is not particularly limited in the present disclosure. The air purifier may be an air filter or an integral purifier capable of removing harmful substances such as formaldehyde as long as impurities in the passing air can be filtered out.

Optionally, the resistance reducing part 03 is uniformly arranged or arranged in a square frame at the stage 02. For example, the resistance reducing part 03 may be uniformly disposed on a surface of the stage 02 for placing the metal frame 01, therefore it is applicable to metal frames 01 with various shapes. For example, the shape of the resistance reducing part 03 is set to match the shape of the metal frame 01 to be machined. When the metal frame 01 to be machined is operated, the metal frame 01 to be machined needs to be placed on the resistance reducing part 03 so that the utilization effect of the resistance part 03 can be ensured. For another example, when the shape of the metal frame 01 is a hollow frame shape as shown in FIG. 2, the resistance reducing part 03 may be disposed only at the carrying position of the stage 02. It should be noted that the resistance reducing part 03 can be arranged in any way as long as the frictional resistance between the metal frame and the stage when they move relative to each other can be reduced when the metal frame is pushed inwards from the two opposite sides.

It should be further noted that in the above description of the resistance reducing part 03 in the present disclosure, the resistance reducing part 03 may be rolling elements 031 provided at the stage 02 or an air supplying member 032. In addition, at the stage 02, both of the rolling elements 031 and the air supplying member 032 can be provided at the same time, so that when the airflow blown upwards from the air supplying member 032 is insufficient to separate the metal frame 01 from the stage 02, the airflow from the air supplying member 032 can at least cancel out part of the weight of the metal frame 01, and at the same time the rolling elements 031 convert the sliding friction between the metal frame 01 and the stage 02 into rolling friction force. The combination of the two can reduce the frictional resistance between the metal frame 01 and the stage 02 during relative movement. When the flow rate of air blown upward from the air supplying member 032 is gradually increased until the separation between the metal frame 01 and the stage 02, the friction between the metal frame 01 and the stage 02 is completely eliminated.

Figure 13:
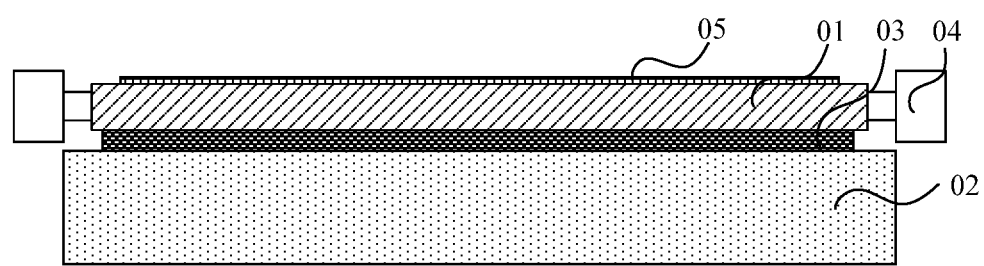
FIG. 13 is a schematic structural view showing that the manufacturing apparatus for manufacturing the mask frame assembly is provided with a thrust member.

Optionally, as shown in FIG. 13, for any one of the manufacturing apparatuses for manufacturing a mask frame assembly described above, a thrust member 04 capable of pushing the two opposite sides of the metal frame 01 inward is also included.

The thrust member 04 shown in FIG. 13 is a hydraulic cylinder. However, in the present disclosure, the thrust member 04 is not particularly limited, and the thrust member 04 may be another driving member, as long as the thrust member 04 can drive the metal frame 01 at the opposite sides of the metal frame 01 to do inward pushing movement.

The foregoing descriptions are merely specific embodiments of the present disclosure, but the protection scope of the present disclosure is not limited thereto. Anyone skilled in the art may easily conceive changes and substitutions within the technical scope disclosed in the present disclosure, which should be covered by the scope of the present disclosure. Therefore, the protection scope of the present disclosure should be based on the protection scope of the claims. For example, the tensioner of the present application is not limited to tensioning the mask in the field of display device manufacturing technology. It can also be applied to other technical fields that require tensioning the film.

The invention claimed is:

1. A manufacturing apparatus for manufacturing a mask frame assembly having a mask and a frame, the manufacturing apparatus comprising:
   a stage for carrying a frame,
   a resistance reducer located on the stage, and
   a thruster configured to push opposite sides of the frame inward, wherein the thruster is configured to apply a pushing force to the frame before the mask is bonded so that the frame is in a pressed state, and remove the pushing force after the mask is bonded so that the mask generates a tension restoring to a natural state, the tension configured to cancel out some of a shrinking force of the mask,
   wherein the resistance reducer comprises an air supper which is configured to blow air towards a surface of the frame near the stage when the thruster pushes the opposite sides of the frame inward to reduce or eliminate a frictional resistance between the frame and the stage when they move relative to each other, thereby reducing an error between an actual deformation and a simulated deformation of the frame when the thruster pushes the opposite sides of the frame inward.

2. The manufacturing apparatus according to claim 1, wherein a plurality of through holes arranged in matrix form are provided in the stage, an air outlet of the air supplier is communicated with an end of each through hole facing away from the frame.

3. The manufacturing apparatus according to claim 2, wherein a pressure control valve is provided at a position where each of the through holes is connected to the air outlet of the air supplier.

4. The manufacturing apparatus according to claim 1, wherein the air supplier is further provided with an air dryer.

5. The manufacturing apparatus according to claim 1, wherein the air supplier is further provided with an air purifier.

6. The manufacturing apparatus according to claim 1, wherein the resistance reducer comprises a plurality of rolling elements, a top end of each rolling element protrudes from a surface of the stage for placing the frame.

7. The manufacturing apparatus according to claim 6, wherein the rolling elements comprise rolling shafts and rollers sleeved on the rolling shafts, longitudinal axes of the rolling shafts are parallel to the surface of the stage for placing the frame and perpendicular to a pushing movement direction of the frame.

8. The manufacturing apparatus according to claim 6, wherein the rolling elements comprise balls, grooves are formed on the stage at positions corresponding to the balls, and the balls are disposed in the grooves.

9. The manufacturing apparatus according to claim 1, wherein the resistance reducer is arranged in a square frame shape.

10. The manufacturing apparatus according to claim 1, wherein the frame is a metal frame.

11. The manufacturing apparatus according to claim 2, wherein the frame is a metal frame.

12. The manufacturing apparatus according to claim 6, wherein the frame is a metal frame.

* * * * *